United States Patent [19]

Carrière et al.

[11] Patent Number: 4,861,423

[45] Date of Patent: Aug. 29, 1989

[54] METHOD OF ETCHING A SURFACE OF AN INDIUM PHOSPHIDE PART

[75] Inventors: Claude Carrière, Marcoussis; Jean Renard, Paris; Thierry Lavolée, Sainte Genevieve Des Bois, all of France

[73] Assignee: Societe Anonyme dite: ALCATEL CIT, Paris, France

[21] Appl. No.: 176,055

[22] Filed: Mar. 31, 1988

[30] Foreign Application Priority Data

Apr. 1, 1987 [FR] France ............................... 87 04575

[51] Int. Cl.$^4$ ................................................ C23F 1/00
[52] U.S. Cl. .................................... 156/643; 156/647; 156/664
[58] Field of Search ............... 156/643, 647, 646, 664, 156/662

[56] References Cited

U.S. PATENT DOCUMENTS

| | | |
|---|---|---|
| 4,326,911 | 4/1982 | Howard et al. |
| 4,671,847 | 6/1987 | Clawson .............................. 156/635 |
| 4,705,760 | 11/1987 | Kaganowicz et al. .............. 156/651 |
| 4,714,518 | 12/1987 | Satyanarayan et al. ............ 156/653 |
| 4,749,440 | 6/1988 | Blackwood et al. ................ 156/653 |

OTHER PUBLICATIONS

Journal of the Electrochemical Society, vol. 133, No. 10, Oct. 10, 1986, pp. 2204–2205, Manchester, NH, USA; K. Pak et al.: "Vapor-Phase Etching of InP Using Anhydrous HCl and PH3 Gas".

Journal of Vacuum Science & Technology, vol. B3, No. 5, Sep.–Oct. 1985, pp. 1445–1449, American Vacuum Society, Woodbury, New York, USA; M. Hirose et al: "Characterization of Photochemical Processing".

Primary Examiner—David L. Lacey
Assistant Examiner—L. Johnson
Attorney, Agent, or Firm—Sughrue, Mion, Zinn, Macpeak & Seas

[57] ABSTRACT

A wafer of indium phosphide is disposed between two electrodes (102, 104) in a heated enclosure (100) into which ducts (110 and 112) admit nitrogen and ammonia. A high frequency electricity generator (108) forms a plasma between the electrodes which etches the exposed surface of the wafer. The invention is applicable, in particular, to forming semiconductor lasers emitting in the infrared for telecommunications purposes.

9 Claims, 3 Drawing Sheets

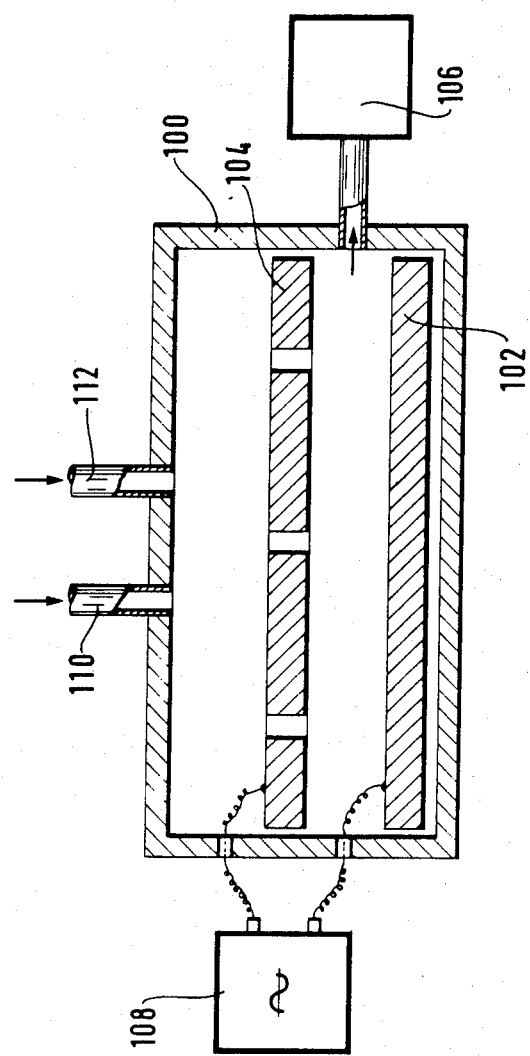

4,861,423

METHOD OF ETCHING A SURFACE OF AN INDIUM PHOSPHIDE PART

The present invention relates to etching a surface of an indium phosphide InP part.

BACKGROUND OF THE INVENTION

Although such etching may be of use in various fields, its effective application is limited at present to certain types of etching when fabricating semiconductor components based on indium phosphide.

The present invention is applicable, more particularly, to fabricating optoelectronic components for use at wavelengths of 1.3 micrometers or greater. Such components are used in telecommunications. Requirements in this field are tending to components which are more and more complex and which are made from wafers of monocrystaline indium phosphide InP. Their manufacture requires a plurality of etching operations in this material.

During each of these operations, an etching procedure is implemented to etch a face which has previously been partially protected by a mask. This etching causes an interconnection flank to appear all around the edge of the mask between the intact zone which was protected by the mask and the zone which was eaten away by the etching. The profile of this flank depends on the etching method selected and on the orientation of the edge under consideration. The higher intact zone constitutes a 'mesa' whose 'type' may be defined by said profile.

Depending on the desired type of profile, several known etching methods may be used. At present, the etching method used most widely in industry is a wet method based on a bromine-methanol solution: a wafer 200 (see FIG. 1) is used whose top face to be etched is oriented on (001) plane. When the protective mask is a tape aligned with the (110) direction, a mesa 202 of the so-called "inverted" type is obtained. The (111) plane is not etched, where the symbol 1 represents the digit 1 with a bar on top; however, etching with a mask aligned with the (110) direction gives rise to a mesa 204 of the so-called "normal" type. The etching profile is very sensitive to crystal planes of any orientation: the flanks of the resulting mesa are substantially plane and are at an angle with the top face of the mesa which is acute in the first case and which is obtuse in the second case.

Other etching solutions, e.g. dilute hydrochlorid acid, may be used when performing wet etching. However these tend to be laboratory methods which are difficult to industrialize.

InP can be dry etched by reactive ion etching (RIE) using a plasma made up of chloride gases which are polarized relative to the wafer to be etched. This method gives rise to etching profiles which are completely insensitive to crystal planes (mesas having vertical flanks).

These various known methods suffer from the drawback of sometimes not enabling a desired profile to be obtained, in particular when a first strip mesa extending in a longitudinal direction has been made and is of the inverted type, and when a second strip mesa running along the same longitudinal direction is to be made but is to be of the normal type. This occurs when the flanks of the second mesa are to receive an effective passivation layer.

Such a layer cannot be obtained by deposition onto the flanks of an inverted mesa. It is very difficult to obtain on vertical flanks.

The object of the present invention is to make it possible, in some cases, to obtain a desired mesa profile which conventional etching methods are incapable of providing.

Another object of the invention is to enable effective passivation on the flanks of a strip-shaped mesa whose orientation on a monocrystaline semiconductor wafer is imposed by other considerations.

Another object of the invention is to make it possible to obtain a highly resistive surface layer on an etched surface of a monocrystaline part.

Yet another object of the invention is to make etching possible using substances which are not very dangerous, which are cheap, and which are easy to manipulate.

SUMMARY OF THE INVENTION

In order to achieve these objects, the present invention provides a method of etching a surface of an indium phosphide part, the method comprising the following operations:

said part is inserted in an etching enclosure provided with electrodes;

a gaseous etching mixture is admitted into the enclosure; and a high frequency alternating electric voltage is applied between said electrodes so as to form a plasma from said etching mixture;

means being provided for subjecting said part to the action of constituents of said plasma;

said method including the improvements whereby said gaseous etching mixture contains ammonia $NH_3$ and a diluting gas; and said means for subjecting said part to the action of constituents of said plasma being at least essentially constituted by the fact that said electrodes are disposed in such a manner as to form said plasma in contact with said surface to be etched.

Preferably, the method further includes a cleaning operation using an acid in order to eliminate etching residues.

The volume concentration ratio of the ammonia to said diluting gas in said etching mixture lies between 0.01 and 10;

said part is raised to an etching temperature lying between 50° C. and 300° C.;

the power density power unit area applied by said electrodes in order to form said plasma over said surface to be etched lies between 0.03 W/cm² and 0.45 W/cm²; and the gas pressure in said etching enclosure lies between about $1.3 \times 10^{-3}$ Pa and about 67 Pa.

Preferably, said diluting gas occupies a major portion of the volume of said etching mixture.

Also preferably, that said concentration ratio lies between 0.2 and 0.7, said diluting gas being nitrogen;

said etching temperature lies between 150° C. and 300° C.;

said power density lies between 0.03 W/cm² and 0.18 W/cm²; and said gas pressure lies between about 27 Pa and about 67 Pa.

In even more particular cases, the method of the invention is applied to making a mesa by etching a face of an indium phosphide monocrystaline wafer, said wafer constituting said part and said mesa being formed by the following operations:
- a monocrystaline wafer is prepared having a face oriented on a (001) plane of its crystal lattice;
- a protective mask is formed on said face for resisting said plasma and leaving a portion of said face exposed to constitute said surface to be etched, said mask having an edge along at least one masking direction; and
- etching said surface by said plasma to form a mesa having an edge following said mask edge with the corresponding flank having a profile which depends on said masking direction.

In this case, one of the following dispositions is preferably adopted, depending on the desired type of mesa:
- for forming a mesa in which said flank is rounded and is initially substantially perpendicular to said face from said edge and is then progressively inclined, flaring outwardly without a preferential plane, wherein said masking direction is the (110) direction of said crystal lattice; or
- for forming a mesa in which said flank has a first portion at an inwardly directed undercut slope from said edge, followed by a second portion which slopes outwardly, wherein said masking direction is aligned with the (110) direction, and said first and second portions of the mesa flank are oriented along the (111) and (111) planes respectively.

The manufacture of a mesa in which the flank has such a second portion which is longer than the first portion, may be performed by selecting said concentration ratio to be 0.27; said etching temperature to be 250° C.; said power density to be 0.044 W/cm$^2$ at a frequency lying between 5 MHz and 30 MHz; and said gas pressure to be 57 Pa; and by allowing said surface to be etched by said plasma for more than about 8 minutes.

BRIEF DESCRIPTION OF THE DRAWINGS

Implementations of the invention are described by way of example with reference to the accompanying drawings, in which:

The implementations of the invention described include the dispositions mentioned above as being preferable in accordance with the present invention. However, it should be understood that the items specified may be replaced by other items providing the same technical functions.

FIG. 4 is a section view through apparatus for implementing the method.

PREFERRED IMPLEMENTATION OF THE INVENTION

Etching by means of a NH$_3$ plasma is dry etching suitable for obtaining an etching profile which is sensitive to crystal planes.

Figure 1:
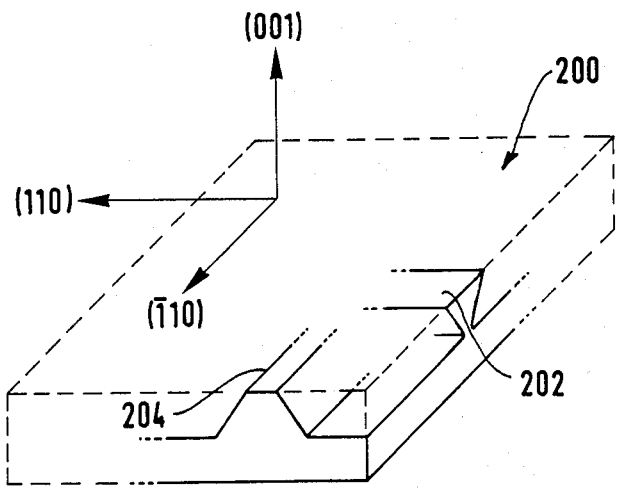
FIG. 1 has already been described and is a perspective view of a monocrystaline wafer of indium phosphide on which various mesas have been etched by the known methanol bromine etching method.
Figure 2:
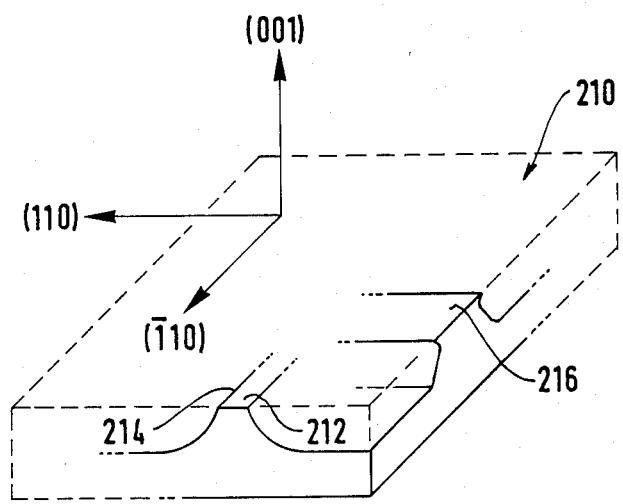
FIG. 2 is a perspective view of an identical monocrystaline wafer on which a plurality of mesas have been etched by the method in accordance with the invention.

NH$_3$ plasma etching can be used to etch an indium phosphide monocrystaline wafer whose top face 210 (see FIG. 2) is oriented along a (001) plane, without having a preferential plane when a strip-shaped protective mask is aligned along the (110) direction. This gives rise to the previously mentioned rounded flank running from the edge 214 of a mesa 212. If the protective mask is aligned along the (110) direction, then a mesa 216 is obtained under the above-specified conditions, having flanks which follow (111) planes over one micrometer and (111) planes over the remainder of the flanks.

A buried heterostructure laser is now described whose fabrication advantageously makes use of the method in accordance with the present invention.

The function of this laser is to emit infrared light for injecting into a telecommunications optical fiber, which light is modulated by a signal carrying the information to be transmitted. The signal is applied between the two electrodes of the laser. The laser is essentially constituted in a monocrystaline indium phosphide wafer (which is the base material).

Figure 3:
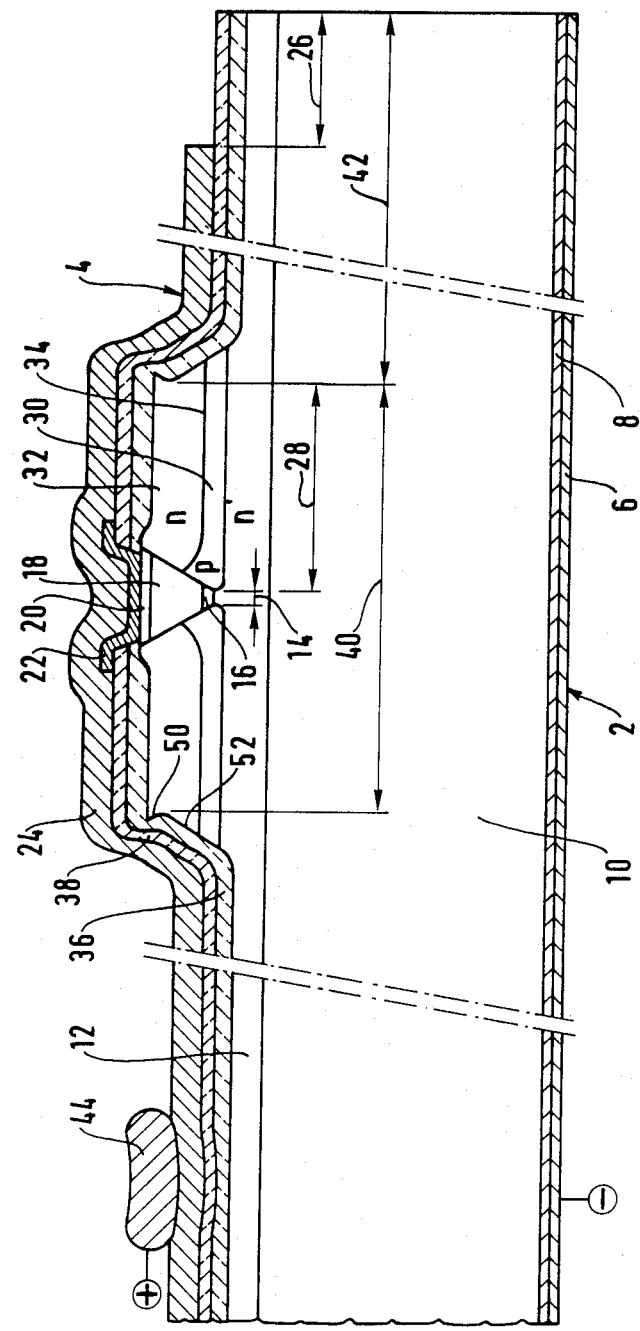
FIG. 3 is a section view through a heterostructure buried laser made using the method of the invention.

As shown in FIG. 3, the laser comprises, going from its back face 2 to its top front face 4, and extending over the entire area of the above-mentioned wafer:
- a backing electrode constituted by an outer layer 6 of titanium, platinum, and gold alloy together with an inner layer 8 comprising an alloy of gold, germanium, and nickel;
- a substrate 10 made of indium phosphide of the type having N conductivity ($5.5 \times 10^{18}$ cm$^{-3}$ doping); and
- a buffer layer 12 of N type indium phosphide ($4 \times 10^{17}$ cm$^{-3}$ Sn doping) which is 4 micrometers thick in zones where it has not been etched.

In a middle zone 14, it then comprises:
- an active layer 16 which is constituted by undoped gallium and indium arsenide and phosphide, within which carriers of positive and negative charges recombine to give rise to said light; the light is confined therein by the difference between the relatively high refractive index of this layer and the index of the surrounding material; it escapes partially through two end mirrors (not shown) parallel to the plane of the sheet and formed by cleaving; the proportions of the various components of this layer are chosen in conventional manner in order to ensure crystaline continuity, the desired value for the wavelength, i.e. 1.3 micrometers, and a suitable refractive index; the thickness of this layer is 0.2 micrometers and its width is 1 to 2 micrometers;
- a confinement layer 18 of P type indium phosphide ($2 \times 10^{17}$ cm$^{-3}$ Zn doping), with a thickness of 2 to 4 micrometers; the flanks of this layer flare upwardly constituting an inverted internal mesa such that the width of the top face of this layer is 5 to 10 micrometers; this internal mesa is buried between burying layers which are described below;
- a high p-doped contact layer 20 ($3 \times 10^{18}$ to $7 \times 10^{18}$ cm$^{-3}$ Zn doping) constituted by gallium and indium arsenide and phosphide, with the monocrystaline wafer extending from the substrate 10 up to and including said contact layer;
- an inner front electrode layer 22 constituted by a gold-zinc alloy and extending transversally to a small distance beyond the confinement and contact layers; and an outer metal layer constituting said front electrode 24, said layer being made of an alloy of titanium, platinum, and gold, and extending over the entire surface of the wafer except for edge zones such as the zone 26 where it is omitted.

In the two burying zones such as 28 on either side of the middle zone, the laser comprises, going from the buffer layer 12:

an inner burying layer 30 constituted by P-type indium phosphide and having a thickness of 1.5 to 2 micrometers;

an outer burying layer 32 of N-type indium phosphide having a thickness of 2.5 to 3.5 micrometers; the monocrystaline wafer stops at said layer which, together with the inner burying layer, forms a blocking junction 34; the interfaces between these buffer and burying layers curve in the vicinity of the middle zone;

a passivation layer 36 constituted by a compound of silicon and nitrogen, e.g. $Si_3N_4$, and having a thickness of 0.2 micrometers; this compound is electrically insulating and has a coefficient of thermal expansion which is very close to that of indium phosphide, thereby avoiding the appearance of disorder at the interface after said layer has been deposited;

a silica protective layer 38; these passivation and protection layers extending over the entire surface of the water; and said front electrode 24.

An external mesa designated by reference 40 occupies the middle zone 14 as a whole together with the two burying zones 28. It is 50 micrometers wide, for example.

In two side zones 42 on either side of said mesa, the laser comprises, going from the buffer layer 12 which is of reduced thickness in this case:

said passivation layer 36;
said protective layer 38; and
said front electrode 34 except in the edge zones such as 26.

It further comprises, at least in one of these two side zones, a connection conductor wire 44 made of gold, for example, and which is ultrasonically and compression welded to the front electrode 24.

The laser may be 300 micrometers wide, for example.

The backing electrode 6, 8 and the connection conductor wire 44 are connected to the negative and the positive terminals of a modulatable D.C. voltage supply (not shown).

The end faces (not shown) constituting mirrors are obtained in conventional manner by cleaving the initial wafer along a preferential cleavage crystal plane.

More precisely, with respect to the indium phosphide crystal lattice, the horizontal plane of the front face is a (001) plane and the transverse vertical plane of the end face is a (110) plane, with the longitudinal direction which is perpendicular to said transverse vertical plane thus being a (110) direction.

The laser constituted in this way can be directly modulated to transmit data at several gigabits per second.

This laser may be obtained from an initial monocrystaline wafer by depositing metals and insulators and by cleaving using well-known procedures. The wafer may itself be obtained, as described below, in which it should be understood that the same names and reference numerals are used to designate a small sized layer in the above-described completed laser and a larger layer having the same constitution and from which the small sized layer is obtained by etching and cleaving.

Beginning with a monocrystaline substrate 10 at (001) orientation, epitaxial deposition is performed thereon using conventional methods in order to form the buffer layer 12, the active layer 16, the confinement layer 18, and the contact layer 20, with each of said layers extending over the entire area of the wafer.

These layers are then etched using a bromine-methanol solution containing 2.5% bromine by volume in order to form said internal mesa. During this etching, a conventional type of protective mask is used in the form of a strip that is oriented along the (110) direction. As a result, this direction constitutes said longitudinal direction. Given the selected orientation, the mesa formed in this way is an inverted mesa.

After well-known surface preparation operations, the said two burying layers 30 and 32 are epitaxially deposited on the buffer layer which was previously etched through a portion of its thickness.

Then, in order to provide said external mesa by etching, a protection mask of the same type is used oriented along the same longitudinal direction as before. If the conventional etching method using a bromine-methanol solution were then used, an inverted mesa would be obtained as before. It would then no longer be possible to provide adequate passivation by conventional methods since the passivation material would be poorly deposited on the undercut flanks of the mesa. In accordance with the present invention, after making the protective mask which extends along the longitudinal direction, the etching method of the invention is used as described below.

The etching is performed in a housing, e.g. a housing of the PD80 type sold by Plasma Technology Corporation and which is normally used for implementing a conventional deposition method known under the initials EPCVD (Enhanced Plasma Chemical Vapor Deposition). This housing is shown in FIG. 4. It comprises:

an enclosure 100;
a bottom hot plate 102 constituting an electrode and carrying the wafers to be treated;
a top plate 104 constituting an electrode and allowing gas to be inserted from ducts 110 and 112;
a pumping system 106 including a primary pump of the Alcatel 2063 type as sold by Alcatel CIT;
a high frequency electricity generator 108 operating at 13.56 MHz; and
means for inserting and removing wafers and for cooling them (not shown).

Plasma etching is performed by means of a $NH_3/N_2$ mixture of gases, with the sample to be etched being heated. The four parameters which have an effect on the etching speed are the concentration of $NH_3$, the temperature of the sample, the power density delivered by the generator, and the working pressure (the gas pressure inside the enclosure).

Appropriate operating ranges lie approximately:

for gas concentration, the ratio $NH_3/N_2$ should lie between 0.01 to 10, by volume, and should preferably lie between 0.2 and 0.7;

the sample temperature should be between 50° C. and 300° C., and should preferably be between 150° C. and 300+ C.;

the power density should be between 0.03 $W/cm^2$ and 0.45 $W/cm^2$, and preferably between 0.03 $W/cm^2$ and 0.18 $W/cm^2$; and the pressure should lie between $1.3 \times 10^{-3}$ Pa and 67 Pa, and should preferably lie between 27 Pa and 67 Pa. In some cases, indium residues may remain on the surface after etching. The sample can be cleaned with sulfuric acid to obtain a clean surface.

For example, if the ratio $NH_3/N_2$ is 0.27, the temperature is 250° C., the power density is 0.044 W/cm$^2$, and the pressure is 57 Pa, then the method eats into the indium phosphide down to a depth of 6.2 micrometers in 11 minutes, 30 sec.

This method would etch along a preferential plane if the strip-shaped protective mask was oriented along the transverse direction (110) on a (001) oriented substrate. In the present case, where the mask is oriented along the (110) direction and where the above-mentioned values are adopted, a mesa is obtained whose flanks are initially oriented along a (111) plane like an inverted mesa, but only over one micrometer, thereafter the flanks are oriented along a (111) plane for the remainder of the flank. In other words, the resulting mesa is very similar to the desired normal mesa, in particular in the most critical region which is where it is flush with the blocking junction 34. In FIG. 3, the first, minor portion of inverted slope of the flank is given reference numeral 50, and the second, major portion of normal inclination is referenced 52.

This method also has the following properties:

high surface resistivity is obtained after etching, i.e. crystal order is destroyed in the surface layer. This property is advantageous when it is desired, as in the present case, to subsequently passivate said surface by means of an amorphous material, and in particular the silicon and nitrogen compound which is used in the present case;

the etching is selective with respect to indium and gallium phosphide and arsenide In Ga As P, i.e. this material is etched much more slowly than indium phosphide; this may be advantageous for manufacturing semiconductor components other than the above-described laser; and the gases used are easily manipulated and are not very toxic.

We claim:

1. In a method of etching a surface of an indium phosphide part, said method comprising the following operations:

inserting said indium phosphide part in an etching enclosure provided with electrodes;

admitting a gaseous etching mixture into the enclosure; and applying a high frequency alternating electric voltage between said electrodes to form a plasma from said etching mixture and subjecting said indium phosphate part to the action of constituents of said plasma;

the improvements wherein; said operation of admitting a gaseous etching mixture into the enclosure comprises admitting a gaseous etching mixture containing ammonia (NH$_3$) and a diluting gas; and said operation of inserting said indium phosphate part comprises disposing said indium phosphate part so that said plasma is formed in contact with said surface to be etched and etching said surface.

2. A method according to claim 1, further comprising the operation of cleaning said part after contact with the plasma with an acid to remove etching residues.

3. A method according to claim 1, wherein said diluting gas relative to said ammonia is a major part by volume of said etching mixture.

4. A method according to claim 1, wherein the volume concentration ratio of the ammonia to said diluting gas in said etching mixture lies between 0.01 to 10;

said indium phosphide part is raised to an etching temperature lying between 50° C. and 300° C.;

the power density per unit area applied by said electrodes in order to form said plasma over said surface to be etched lies betwen 0.03 W/cm$^2$ and 0.45 W/cm$^2$; and the gas pressure in said etching enclosure lies between about $1.3 \times 10^{-3}$ Pa and about 67 Pa.

5. A method according to claim 4, wherein said concentration ratio lies between 0.2 and 0.7, said diluting gas being nitrogen;

said etching temperature lies between 150° C. and 300° C.

said power density lies between 0.03 W/cm$^2$ and 0.18 W/cm$^2$; and said gas pressure lies between about 27 Pa and about 67 Pa.

6. A method according to claim 4, applied to making a mesa by etching a face of an indium phosphide monocrystaline wafer, said wafer constituting said indium phosphide part said method further comprising before said inserting step:

preparing a monocrystaline wafer having a face oriented on a (001) plane of its crystal lattice;

forming a protective mask on said face for resisting said plasma and leaving a portion of said face exposed, said exposed face constituting said surface of said indium phosphide part to be etched, said mask having an edge along at least one masking direction; and wherein said etching step further comprises, etching said surface by said plasma to form a mesa having an edge following said mask edge with the corresponding flank having a profile which depends on said masking direction.

7. A method according to claim 6, for forming a mesa in which said flank is rounded and is initially substantially perpendicular to said face from said edge and is then progressively inclined, flaring outwardly without a preferential plane, wherein said masking direction is the (110) direction of said crystal lattice.

8. A method according to claim 6, for forming a mesa in which said flank has a first portion at an inwardly directed undercut slope from said edge, followed by a second portion which slopes outwardly, wherein said masking direction is aligned with the (110) direction, and said first and second portions of the mesa flank are oriented along the (111) and (111) planes respectively.

9. A method according to claim 8, for forming a mesa in which said flank second portion is longer than the first portion, and wherein:

said concentration ratio is 0.27;

said etching temperature is 250° C.;

said power density is 0.044 W/cm$^2$ at a frequency lying between 5 MHz and 30 MHz;

said gas pressure is 57 Pa; and said surface is etched by said plasma for more than about 8 minutes.

* * * * *